United States Patent [19]
Nakanishi et al.

[11] Patent Number: 5,214,318

[45] Date of Patent: May 25, 1993

[54] SEMICONDUCTOR INTEGRATED CIRCUIT DEVICE HAVING A SIGNAL TRANSMISSION LINE PAIR INTERCONNECTED BY PROPAGATION DELAY TIME CONTROL RESISTANCE

[75] Inventors: Keiichirou Nakanishi, Kokubunji; Mararu Osanai, Hachioji; Minoru Yamada, Hanno; Masakazu Yamamoto, Hadano; Akira Masaki, Musashino; Mitsuo Usami, Ome, all of Japan

[73] Assignee: Hitachi, Ltd., Tokyo, Japan

[21] Appl. No.: 638,568

[22] Filed: Jan. 7, 1991

[30] Foreign Application Priority Data

Jan. 12, 1990 [JP] Japan .................. 2-003581

[51] Int. Cl.$^5$ .................. H03K 3/335; H04B 3/04
[52] U.S. Cl. .................. 307/303; 328/56; 333/20
[58] Field of Search .................. 307/303, 303.2, 304; 333/20, 22 R, 246; 328/56; 357/68, 71

[56] References Cited

U.S. PATENT DOCUMENTS

| | | | |
|---|---|---|---|
| 4,593,211 | 6/1986 | Belforte | 307/455 |
| 4,626,889 | 12/1986 | Yamamoto et al. | 357/71 |
| 4,980,580 | 12/1990 | Ghoshal | 307/306 |
| 5,027,013 | 6/1991 | Coy et al. | 307/455 |

FOREIGN PATENT DOCUMENTS 60-134440 7/1985 Japan .
63-052322 9/1986 Japan .

OTHER PUBLICATIONS

Sedra et al., "Microelectronic Circuits", CBS College Publishing, 1987, p. 946.

Primary Examiner—William L. Sikes
Assistant Examiner—Toan Tran
Attorney, Agent, or Firm—Antonelli, Terry, Stout & Kraus

[57] ABSTRACT

A semiconductor integrated circuit device has, in one embodiment, a pair of signal transmission lines formed over and insulated from a semiconductor substrate, a first circuit formed in the semiconductor substrate and electrically connected with one end of the pair of signal transmission lines for sending an electric signal, and a second circuit formed in the semiconductor substrate and electrically connected with the other end of the pair of signal transmission lines for receiving the electric signal propagating over the transmission line pair. A control resistance is electrically connected between the pair of transmission lines at the above-mentioned other end for controlling a delay time of the signal propagating over the pair of signal transmission lines between the opposite ends of the pair of signal transmission lines.

13 Claims, 12 Drawing Sheets

SEMICONDUCTOR INTEGRATED CIRCUIT DEVICE HAVING A SIGNAL TRANSMISSION LINE PAIR INTERCONNECTED BY PROPAGATION DELAY TIME CONTROL RESISTANCE

BACKGROUND OF THE INVENTION

This invention relates to a semiconductor integrated circuit device in which signal transmission from one to another among circuit elements constituting the device is made through signal transmission lines which are formed over, and insulated from, a semiconductor substrate, and, more particularly, to a semiconductor integrated circuit device which performs high-speed signal transmission through transmission lines having a high electric resistance.

Due to increased lengths of transmission lines as a result of increased integration density and substrate area of recent semiconductor integrated circuit devices, increased signal propagation delay time within the device is an emerging problem. The problem is attributed to the fact that the signal transmission based on the near end termination technology (scheme) among circuit elements (internal logic gates) of an integrated circuit device has a signal propagation delay time which is proportional to the square of the line length. The near end termination scheme is to drive signal lines through termination resistors connected at the sending end of the lines. At present, this technology is widely used for the signal transmission among circuit elements in a semiconductor integrated circuit device for taking advantage of the fact that signals are free from voltage drop even on high-resistance lines.

There is a much faster signal transmission scheme as compared with the near end termination scheme, and this technology, called "far end termination" technology (scheme), is to connect termination resistors at the receiving end of signal lines. Although the far end termination scheme, in which the signal propagation delay time is proportional to the line length, is an effective transmission scheme, a constant current flowing on each line can incur a lowered signal level due to a voltage drop, which jeopardizes the normal logical operation, when high-resistance lines are used in the integrated circuit device.

As a technique for vitalizing the far end termination scheme even against a lowered signal level in the above-mentioned circumstance, there has been proposed a signal transmission scheme based on differential signals on a pair of transmission lines, as described in JP-A-60-134440 published on Jul. 17, 1985 corresponding to U.S. Pat. No. 4,626,889 issued on Dec. 2, 1986). This differential transmission scheme is designed to transmit complementary outputs consisting of an output and its inverted version from a logic gate over a pair of lines and to receive the signals with a differential circuit having the far end termination, so that the signal amplitude is doubled in effect thereby to counteract the reduction of signal amplitude which is inherent in the far end termination scheme.

Another technique intended to prevent the emergence of signal reflection due to unmatched impedances at the sending end and receiving end is the provision of termination resistors at both sending and receiving ends of a pair of lines, with series resistors being inserted between the terminating resistors and line ends, as described in JP-U-63-52322 published on Apr. 8, 1988.

Although the proposal in the patent publication JP-A-60-134440 does not mention the determination of the termination resistance for the far end termination, the matched termination having the termination resistance set equal to the characteristic impedance of the line is generally used with the intention of preventing the emergence of a reflection noise due to unmatched impedance at the receiving end.

However, signal lines running in an integrated circuit device have characteristic impedances ranging usually 20–30 ohms, and even if the line resistance is as high as twice to three times the characteristic impedance, the current to be supplied by a logic gate is as large as several times that of the case of near end termination, and consequently a logic gate which drives the line pair with far end termination is required to have a large current supply capacity comparable to a transistor. On this account, in fabricating a semiconductor device of a certain integration density, the differential far end termination scheme is advantageous over the near end termination scheme in regard to the signal transmission speed, while the former is disadvantageous against the latter in regard to the chip size and power consumption.

In making an attempt to overcome the problem of unmatched impedance, there is proposed the insertion of series resistors on the line pair, as described in JP-U-63-52322. However, the resistance of the series resistors at both line ends, in addition to the resistance of the line pair, may cause the signal voltage to fall at the receiving end more severely as compared with the technique proposed in the patent publication JP-A-60-134440.

Generally, for the propagation of a logical signal within an integrated circuit device, a signal received by a receiving logic gate needs to have the recovery of the nominal signal amplitude before it is directed to the following stage. However, the proposal described in the JP-U-63-52322 is not concerned about how to counteract the reduction of signal amplitude during the transmission inside the integrated circuit device.

SUMMARY OF THE INVENTION

An object of this invention is to provide a semiconductor integrated circuit device having a shorter signal propagation delay time.

Another object of this invention is to provide a semiconductor integrated circuit device using a differential transmission circuit having a shorter signal propagation delay time which is operative to recover the signal level at the receiving end without the need of an increased size of logic gates and increased power consumption.

According to one aspect of this invention, which is based on the differential signal transmission scheme, a pair of signal transmission lines (will be termed simply "line pair") are terminated at the sending end and coupled to each other through a resistor at the receiving end.

In one embodiment of this invention, use is made of, as a logic gate which drives line pair, an ECL circuit including an emitter-follower circuit connected to a pair of lines that are provided with sending end termination resistors, or a push-pull circuit connected to a pair of lines that are provided with sending end termination resistors. Further, as a circuit for receiving signals on the line pair, a high-gain amplifying circuit which comprises one or more stages of voltage amplifying circuit connected between the differential amplifier and current amplifying circuit.

According to another aspect of this invention, a pair of lines having a length of 20 mm or more are divided into two segments or more, with an intermediate amplifying circuit having an input and output and inverted versions thereof being inserted at each node of line segments.

According to a further aspect of this invention in a case where a plurality of electrical connection layers are laminated, with insulating layers interposed therebetween, over a semiconductor substrate, for a pair of lines on the n-th electrical connection layer, no other lines on the (n+1)th and (n−1)th electrical connection layer are allowed to run in parallel to or across the n-th line pair.

According to a further aspect of this invention, in a case where a plurality of electrical connection layers are laminated, with insulating layers interposed therebetween, over a semiconductor substrate, for a pair of lines on the n-th signal conductor layer, the insulating layer between the line pair on the (n+1)th and (n−1)th conductor layers is formed thicker than those for electrical connection layers that are not based on the differential signal transmission scheme.

According to a further aspect of this invention, a resistor interconnecting a pair of lines at the receiving end has a resistance lower than or equal to the resistance of the line pair.

The present invention is based on the knowledge acquired by investigation of the prior art as will be described in the following.

First, comparison is made, among the conventional near end termination scheme, conventional differential signal transmission scheme with far end matched termination, and the differential signal transmission scheme adopted by the present invention, with respect to the value of current to be supplied by a logic gate.

In the signal transmission based on the near end termination scheme, little current flows on the transmission line, and the current value $I_1$ to be supplied by a sending logic gate is determined by the resistance $R_1$ of the termination resistor connected at the sending end.

In the case of the combination of the differential transmission circuit and far end matched termination, all currents flow in the termination resistors at the receiving end through the line pair, and the current value $I_2$ to be supplied by a sending logic gate is determined by the sum of resistances $R_2$ of the termination resistors at the receiving end.

In the case of the differential transmission circuit adopted by the present invention, currents flow in both of the termination resistors connected at the sending end and the line pair, and the current value $I_3$ to be supplied by a logic gate is determined by the parallel resistance $R_3$ of the resistances of the termination resistors and the line pair.

These resistances $R_1$, $R_2$ and $R_3$ are in a relation of $R_1 > R_2 > R_3$, and therefore the respective current values to be supplied by a logic gate for producing a certain output voltage level are in a relation of $I_2 > I_3 > I_1$. Accordingly, the differential transmission scheme adopted by the present invention is advantageous over the conventional combinational scheme of the differential transmission circuit and far end matched termination in regard to the current in the gate, i.e., the power consumption of a gate.

The next viewpoint is the propagation delay time in the signal transmission lines based on each termination scheme. With the application of a certain voltage at the sending end of a high-resistance transmission line, observation of the voltage waveform at an open receiving end and the current waveform on a short-circuited receiving end reveals that the rise time of the current is shorter by ⅓ to 1/10 than the rise time of the voltage, as is known generally in the art.

The conventional near end termination scheme is equivalent to the above-mentioned open receiving end, and this is the most unfavorable case in regard to the rise time of the receiving voltage waveform. In contrast, the conventional combinational scheme of differential transmission and far end matched termination and the differential transmission scheme adopted by the present invention can accomplish voltage rise times which is intermediate between the above-mentioned cases of the open receiving end and short-circuited receiving end. The determinative factor of the voltage rise time is the resistance of the termination resistor in the conventional scheme of differential transmission and far end termination or the resistance of the resistor interconnecting the line pair at the receiving end, and in any case the smaller the resistance, the shorter the rise time is.

The discussion on the current (power) consumption of circuit and the speed-up of the rise time is concluded in that the differential transmission scheme adopted by the present invention can accomplish a rise time as fast as the conventional combinational scheme of differential transmission and far-end matched termination, even with the consumption of less power.

The final viewpoint is the restoration of signal amplitude at the receiving end. When the signal rise time is sped up through the reduction of resistance at the receiving end of the line pair, the signal amplitude at the receiving end falls significantly as a result of a voltage division by the resistance of the line pair and the resistance of receiving end resistor. In an example of using ECL circuits for the logic gates of the sending and receiving ends, where a usual ECL circuit has a gain of 4 to 5, a reduction of the signal amplitude at the receiving end to 20% or less of the original signal amplitude at the sending end is beyond the ability of restoration of the signal amplitude by the logic gate at the receiving end. Whereas, by adding a voltage amplifying circuit between the current switch and emitter-follower in the ECL circuit used as a logic gate of the receiving end, it becomes possible to raise the gain to about 20, and this ECL circuit is capable of restoring the signal amplitude even in the case of a signal amplitude attenuation to about 5% at the receiving end.

DESCRIPTION OF THE PREFERRED EMBODIMENT

Figure 1:
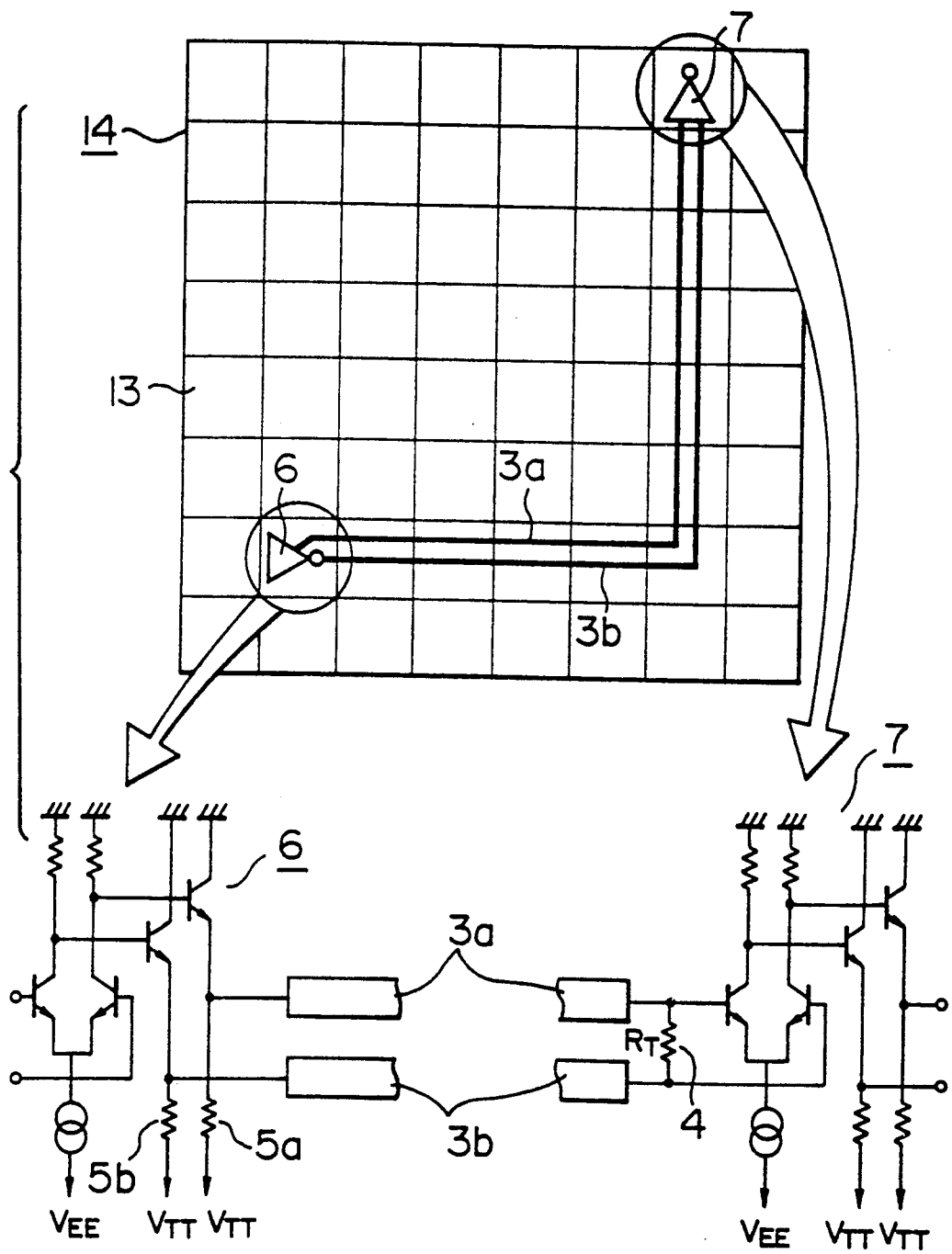
FIG. 1 is a plan view showing in brief a semiconductor integrated circuit device based on an embodiment of this invention.

FIG. 1 is a plan view of a semiconductor integrated circuit device based on a first embodiment of this invention. The integrated circuit device (chip) has its active area 14 divided into a plurality of circuit cell regions 13, and numerous logic gates are formed in each circuit cell region. Circuit cell regions are connected with each other. For example, logic gates 6 and 7 are connected by a pair of transmission lines 3a and 3b which are made of aluminum and formed over and insulated from a semiconductor substrate. In this embodiment, the logic gates 6 and 7 are ECL circuits which produce complementary outputs, e.g., NOR and OR outputs. The sending end ECL circuit 6 has its complementary outputs terminated at its sending end through resistors 5a and 5b. The outputs are connected with a pair of lines 3a and 3b, which are coupled to each other through a control resistor 4 in the receiving end ECL circuit and further connected individually to the complementary inputs of the receiving end ECL circuit. The ECL circuits 6 and 7, line pair 3a and 3b, and resistor 4 are one of multiple sets of integrated circuits incorporated in the semiconductor integrated circuit device 14, and they are used for the connection among circuit cells. Integrated circuits based on the conventional near end termination are also included in the semiconductor integrated circuit device 14 and used for the connection among cells.

The ECL circuits 6 and 7 are each formed of transistors and resistors which are formed by the diffusion or other process in a circuit cell region and are interconnected by aluminum lines formed by evaporation deposition, for example. The resistor 4 is formed by the diffusion process, for example, in a circuit cell region. It is also possible to make the resistors in the ECL circuit and the resistor 4 using polysilicon. The line pair 3a and 3b are formed by the evaporation deposition process of aluminum, for example.

Figure 4:
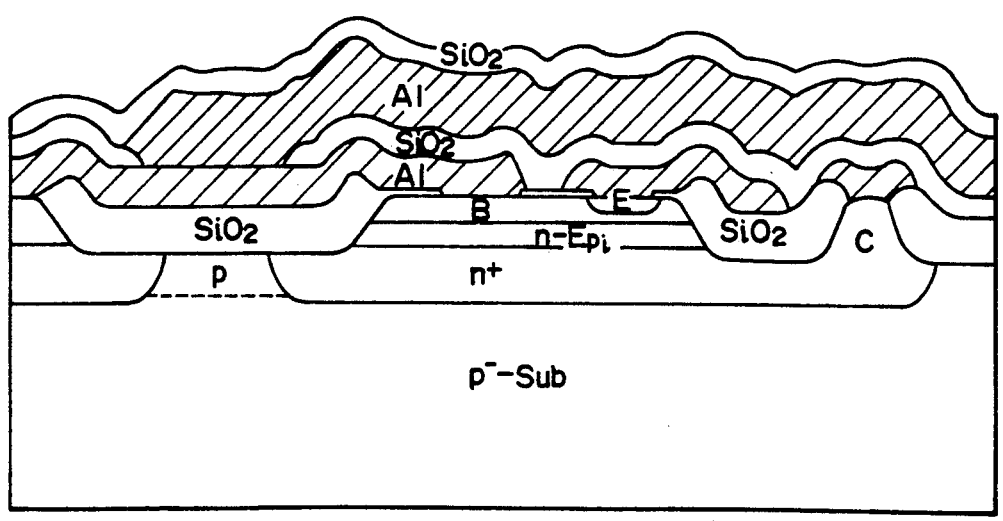
FIG. 4 and FIG. 5 are cross-sectional diagrams showing, as examples, the structure of a transistor, electrical connection layers and diffusion resistor which may be used in embodiments of this invention.
Figure 5:
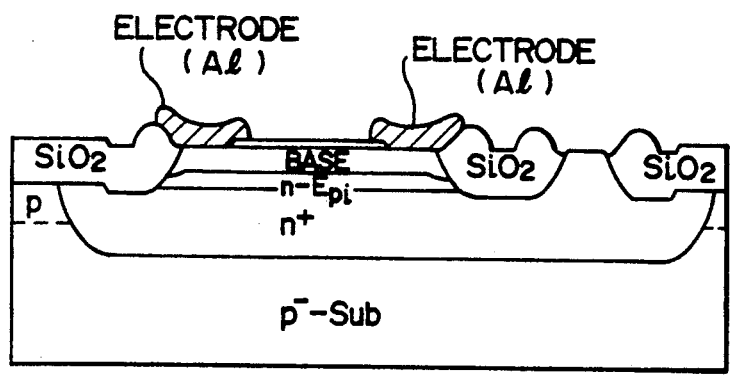

FIG. 4 shows an example of the structure of transistors and aluminum lines used in this embodiment, and FIG. 5 shows the structure of resistors. These circuit elements can readily be formed by the known integrated circuit technology. Among the sending end circuit 6, receiving end circuit 7 and control resistor 4, which are formed in the semiconductor substrate, the resistor 4 may be formed on the semiconductor substrate.

Figure 3A:
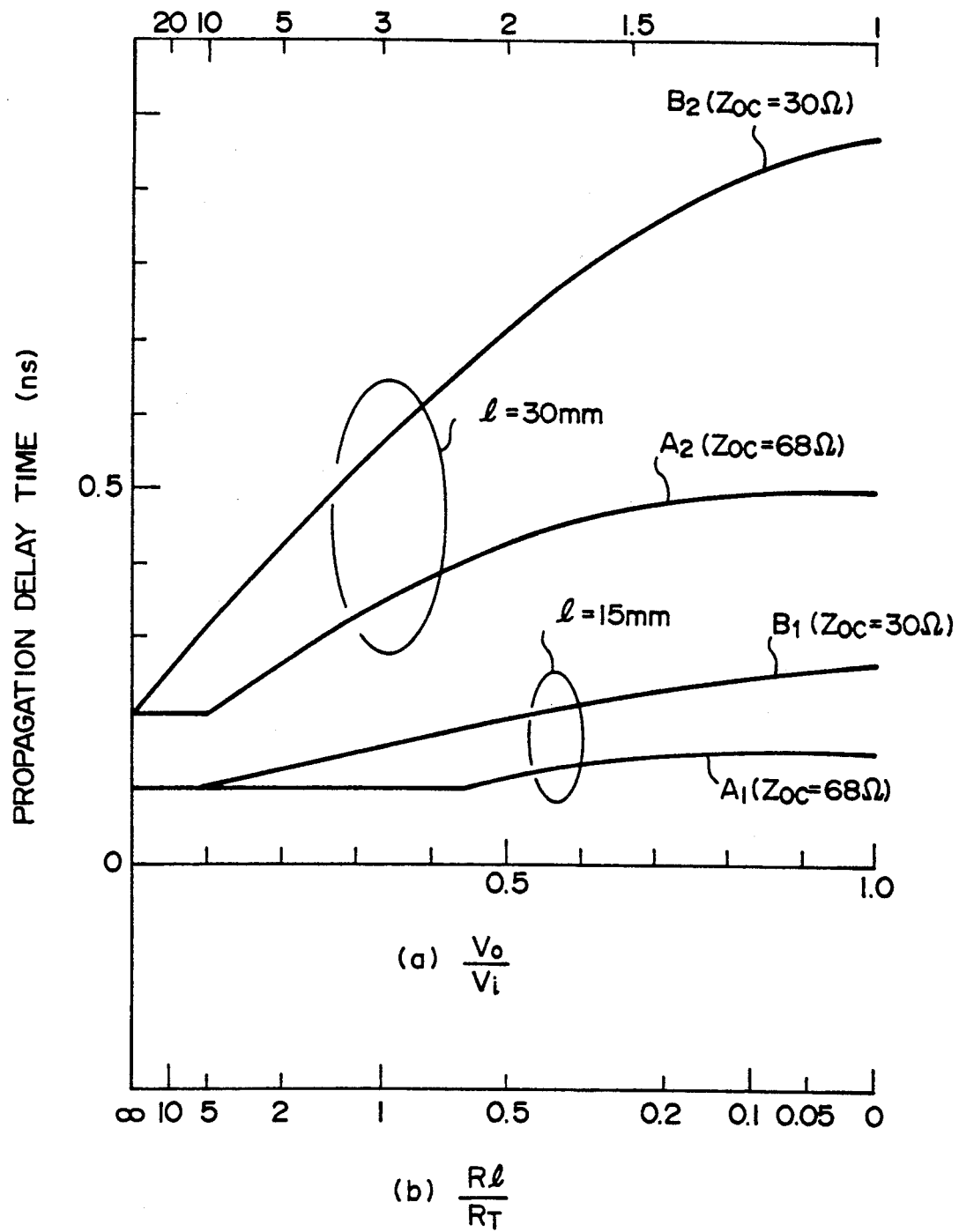
FIGS. 3A and 3B are diagrams showing reduction of the signal propagation delay time based on this invention.
Figure 3B:
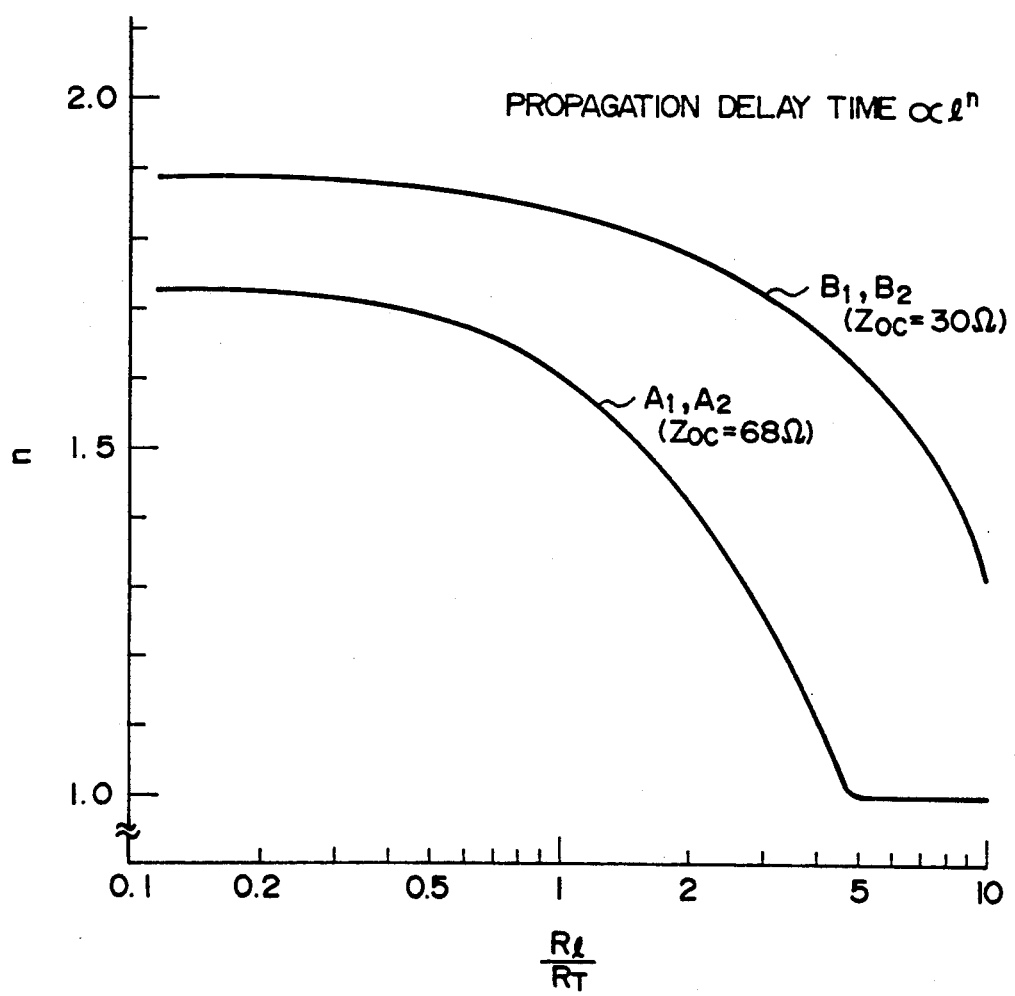

FIGS. 3A and 3B show a result of measurement of the signal propagation delay time conducted for four line pairs having different lengths and characteristic impedances (two different shapes and two different lengths) fabricated in the foregoing integrated circuit. The signal propagation delay time is measured by varying the resistance of the control resistor 4 at the signal receiving end of the line pairs shown in FIG. 1. The four samples have the following characteristics.

Samples $A_1$ and $A_2$:
  Characteristic impedance:
    Line to ground (reference potential line): $Z_{oc}=68$ ohms
    Line to line: $Z_{od}=37$ Ohms
  Line resistance per unit length: R = 12 ohms/mm
  Line length: $l_{A1}=15$ mm (for Sample $A_1$), $l_{A2}$ H = 30 mm (for Sample $A_2$)

Samples $B_1$ and $B_2$:
  Characteristic impedance:
    Line to ground (reference potential line): $Z_{oc}=30$ ohms
    Line to line: $Z_{od}=25$ Ohms
  Line resistance per unit length: R = 12 ohms/mm
  Line length: $l_{B1}=15$ mm (for sample $B_1$), $l_{B2}=30$ mm (for Sample $B_2$)

The line-to-ground characteristic impedance signifies the characteristic impedance between an aluminum line and the element surface or level on which transistors and resistors are formed, and the line-to-line characteristic impedance signifies the characteristic impedance between adjacent lines, which constitute a line pair.

The graph of FIG. 3A has multiple abscissas, of which (a) represents the ratio of the voltage amplitude $V_o$ at receiving end to that $V_i$ at sending end of the line pair, (b) represents the ratio of the d.c. line resistance, which is the product R.1 of the line pair resistance per unit length (R) and the line length 1, to the resistance $R_T$ of control resistor which interconnects the pair of lines at the receiving end, and (c) represents the gain of the receiving end circuit needed to restore the volmtage amplitude $V_o$ of the line receiving end to the voltage amplitude $V_i$ at the sending end. The ordinate of the graph represents the propagation delay time in nanoseconds between thesending end and receiving end of the line pair.

The graph of FIG. 3A reveals that by making the $V_o/V_i$ value smaller than or equal to 0.3, or by making the R.l/$R_T$ value substantially greater than or equal to 1, the propagation delay time can be reduced to about 50% or less of the case compared to the near end termination scheme, where Rl/$R_T$=0 ($R_T=\infty$), even for the sample $B_2$ (with a line length of 30 mm) having the longest delay time among the samples. In this case, the logic gate at the signal receiving end needs to have a gain of 3 or higher. As the value of $V_o/V_i$ decreases, the signal propagation delay time approaches a minimum constant value, since the electromagnetic wave in the medium with a dielectric constant $\epsilon$ and magnetic permeability $\mu$ has its highest velocity limited to $1/\sqrt{\epsilon\mu}$. By setting a gain for 20 or higher for the logic gate at the receiving end, it becomes possible to accomplish the high-speed signal transmission which is only limited by the propagation delay time determined by $\sqrt{\epsilon\mu}$.

In the conventional near end termination scheme of signal transmission, aluminum lines in an LSI device are terminated by pull-down resistors at their sending end and there are no termination resistors at the receiving end. Accordingly, only base currents to the receiving end ECL circuits flow through these lines, and even a high-resistance line (for example, $R.l >> 0.1Z_o$) can propagate the signal amplitude, which is determined by the sending end pull-down resistor, to the receiving end circuit without causing a significant attenuation. This condition is equivalent to the special case of $R_T = \infty$ in this embodiment, as represented by a point of abscissa of $V_o/V_i = 1$, or $Rl/R_T = 0$, on the graph Of FIG. 3A. Generally, transmission lines in an integrated circuit device have high resistivity, and the signal propagation delay time of the near end termination scheme is proportional to the time constant $CRl^2$ which is the product of the line resistance R.l and line capacitance C.l. Accordingly, the line resistance R and line capacitance C are both proportional to the line length l, and eventually the delay time is proportional to the square of the line length l. Therefore, an increase in the line length increases the delay time significantly.

On the other hand, when the value of $V_o/V_i$ falls, or the value of $Rl/R_T$ increases, the signal propagation delay time becomes proportional to the line length l because of the limitation of signal propagation velocity to $\sqrt{\epsilon\mu}$ as mentioned previously, and for a moderate value of $V_o/V_i$, the delay time is proportional to the line length to the power between 1 and 2. FIG. 3B is a graphical representation of this relation, with $Rl/R_T$ being plotted on the abscissa, while the ordinate representing the value n of the power to which the line length the delay time increases. Two curves on the graph are for the same samples $A_1$ and $A_2$ and samples $B_1$ and $B_2$, respectively, as in FIG. 3A. Although both sets of samples would take $n=2$ at the point of $Rl/R_T = 0$, the value of n is already smaller than 2 even for $Rl/R_T = 0.1$ on the abscissa on the graph. The value n decreases as $Rl/R_T$ increases, or $R_T$ decreases. For the samples $A_1$ and $A_2$, the value n is approximately 1 for $Rl/R_T$ being above 5. For the samples $B_1$ and $B_2$ to make $n=1$, the value of $Rl/R_T$ must be increased more drastically.

Figure 8:
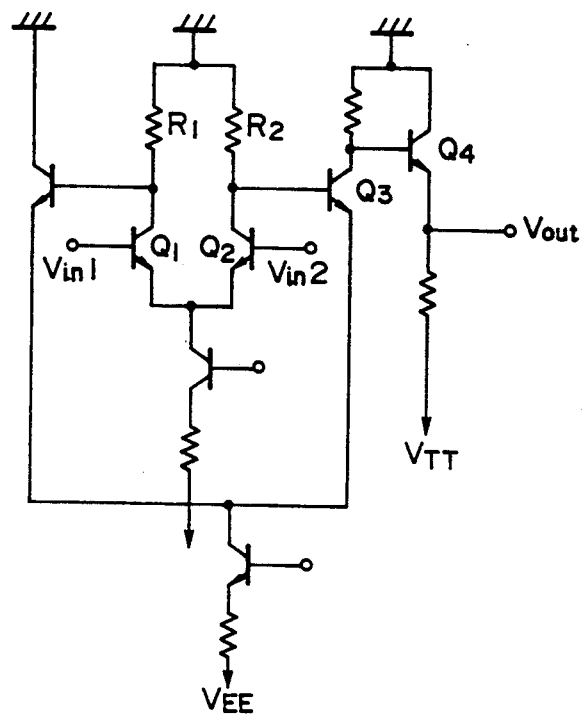
FIG. 8 is a diagram showing a receiving end circuit based on an embodiment of this invention.

In order to provide an increased gain for the logic gate, an amplifying circuit having two-stage emitter followers connected to the differential amplifier as shown in FIG. 8 may be used. This amplifying circuit will be explained later in connection with FIG. 8.

Next, a result of measurement of the current value to be supplied by the sending end ECL circuit will be explained on a comparison basis with the conventional termination schemes.

Figure 2A:
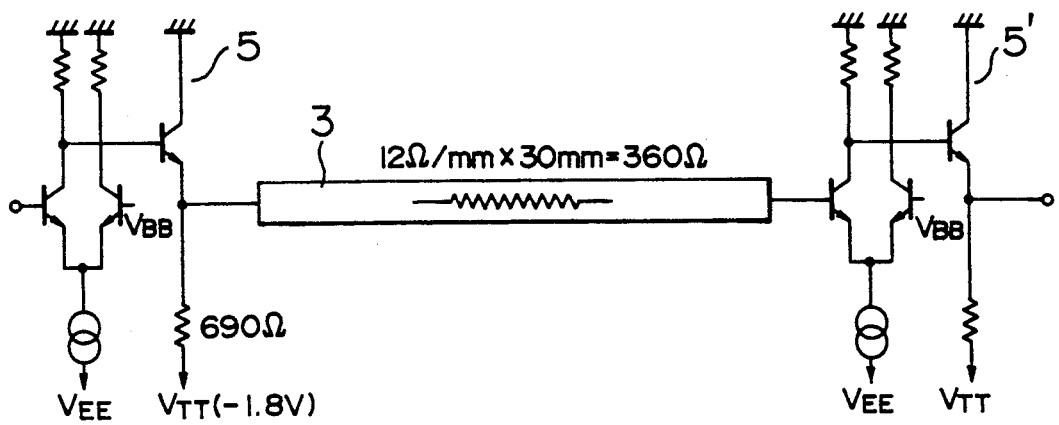
FIGS. 2A through 2C are diagrams comparing a semiconductor integrated circuit device based on an embodiment of this invention with the conventional devices.
Figure 2B:
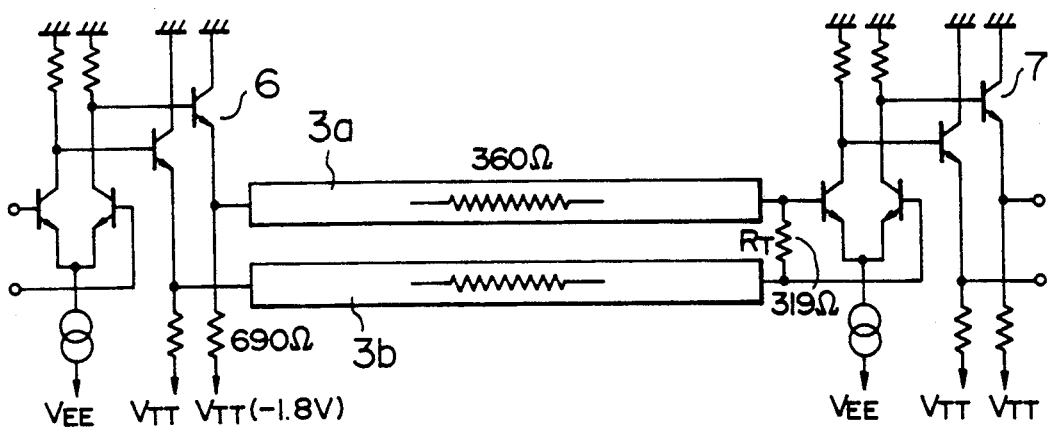
Figure 2C:
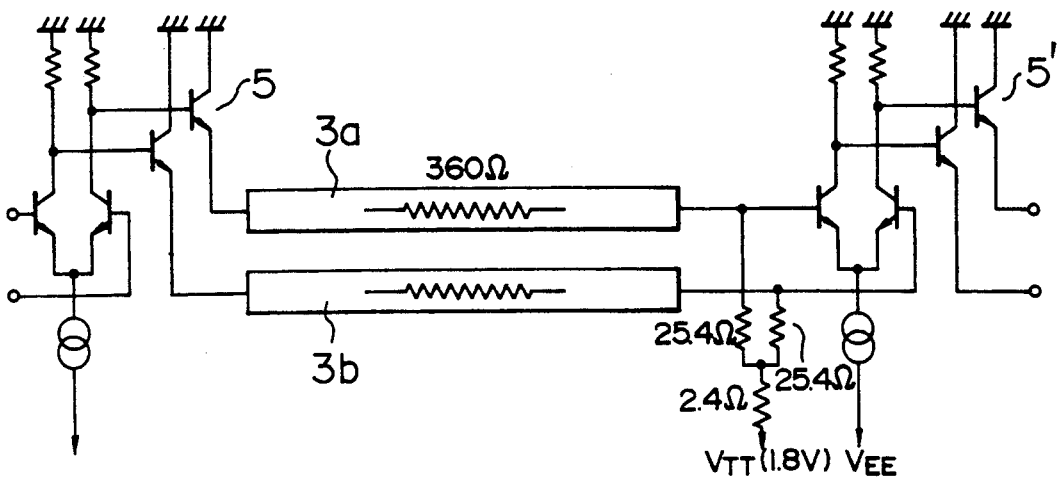

FIGS. 2A to 2C are illustrations of the near end termination scheme, the differential transmission scheme based on an embodiment of this invention, and the differential transmission scheme with far end matched termination, for the case of driving the line(s) 3 having a line-to-ground characteristic impedance of 30.2 ohms, a line-to-line characteristic impedance of 25.4 ohms, a line resistance per unit length of 12 ohms/mm, and a line length of 30 mm, for example, with the ECL circuit 5.

In the case of signal transmission based on the near end termination scheme as shown in FIG. 2A, the signal amplitudes at the sending end and receiving end were about 490 mV, and the currents flowing through the emitter-follower in the sending end ECL circuit 5 were 1.39 mA for the high level and 0.68 mA for the low level, respectively.

In the case of signal transmission based on the differential transmission scheme adopted by the present invention, as shown in FIG. 2B, with the signal amplitude at the sending end being set 490 mV which is equal to the former case, the currents flowing through the emitter-follower in the sending end ECL circuit 6 were 1.86 mA for the high level and 0.21 mA for the low level, respectively. The current value for the high level was about 1.3 times the case of the near end termination scheme, and the intended logical operation was accomplished without the need of altering the current capacity of the transistors. The signal amplitude at the receiving end was 150 mV, and the receiving end logic circuit 7 performed the normal logical operation.

In the case of the combination of the differential transmission circuit and the far end matched termination, as shown in FIG. 2C, with the signal amplitude at the sending end being set 490 mV which is equal to the former cases, the currents flowing through the emitter-follower were 2.47 mA for the high level and 1.20 mA for the low level, respectively. These current values were about twice as large as the case of the near end termination scheme, requiring an increased current capacity of the transistors. The signal amplitude at the receiving end was about 32 mV. The attenuation was too great, as compared with the inventive arrangement shown in FIG. 2B, for he ECL circuit $5'$ in the same configuration as the driving gate, and it necessitated a special high-gain amplifying circuit.

Figure 6:
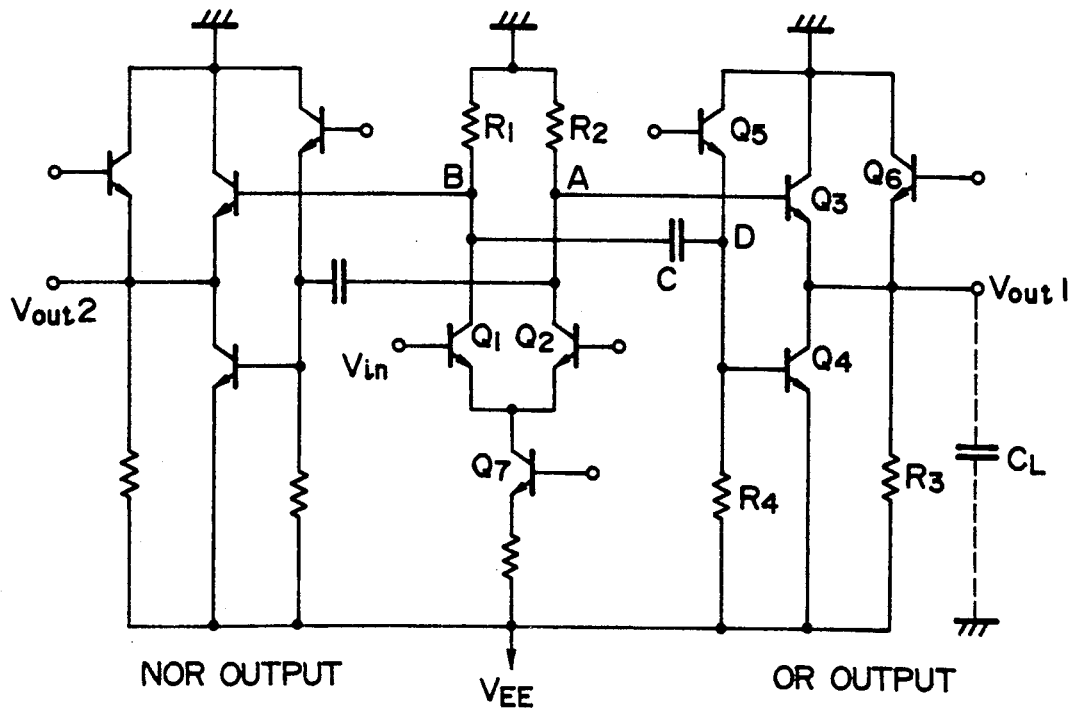
FIG. 6 is a diagram showing a sending end circuit based on an embodiment of this invention.

FIG. 6 is a schematic diagram showing the principal portion of the circuit arrangement based on a second embodiment of this invention. This embodiment is derived from the sending end ECL circuit 6 shown in FIG. 6, with its emitter-follower stage being replaced with a push-pull circuit. Only the push-pull ECL circuit section in FIG. 6, and the operation of this is discussed below.

The push-pull ECL circuit of FIG. 6 has two output terminals $V_{out1}$ for delivering an OR gate output and $V_{out2}$ for delivering a NOR gate output for the input voltage $V_{in}$, i.e., it provides complementary outputs. The following explains the operation of the circuit in producing the OR gate output $V_{out1}$ in response to the input $V_{in}$. When the input value $V_{in}$ has made a level transition from low to high, the current switching circuit formed of transistors $Q_1$ and $Q_2$ and resistors $R_1$ and $R_2$ produces a high voltage and a low voltage at nodes A and B, respectively. Then, a transistor $Q_3$ is supplied with a base current, and it turns on to produce a current flowing from its collector to its emitter and to a resistor $R_3$, yielding the OR gate output at the output terminal $V_{out1}$ for the input $V_{in}$. The operation up to this point is identical to the usual ECL circuit, in which the transistor $Q_3$ in a low-resistance state causes a load $C_L$ connected to the output $V_{out1}$ to be charged quickly, and consequently the high-speed operation is possible. In this state, node B is lower in voltage than node D, causing a capacitor C to be charged.

When the input $V_{in}$ has made a level transition from high to low, the voltage at the output node A of the current switching circuit goes low, causing the transistor $Q_3$ to be cut off. In the usual ECL circuit, where $Q_4$, $Q_5$, $Q_6$, $R_4$ and C are absent, the output $V_{out}$ has its fall time determined by the time constant of the resistor $R_3$ and the load capacitance $C_L$, and the high-speed operation cannot be expected. In contrast, according to this embodiment, node B goes higher in voltage than node D, causing the capacitor C to discharge to the transistor $Q_4$. Then, the transistor $Q_4$ turns on and discharges the load capacitance in a short time. Consequently, the high-speed operation for the signal falling edge can be accomplished. A transistor $Q_5$ provides a bias voltage for the transistor $Q_4$, and a transistor $Q_6$ clamps the low level of the output $V_{out1}$ so that the transistor $Q_4$ is not saturated by an excessively small low level.

The operation for the NOR gate output $V_{out2}$ is basically the same as the output $V_{out1}$, with the only difference being the inverted output provided by the current switching circuit.

Figure 7A:
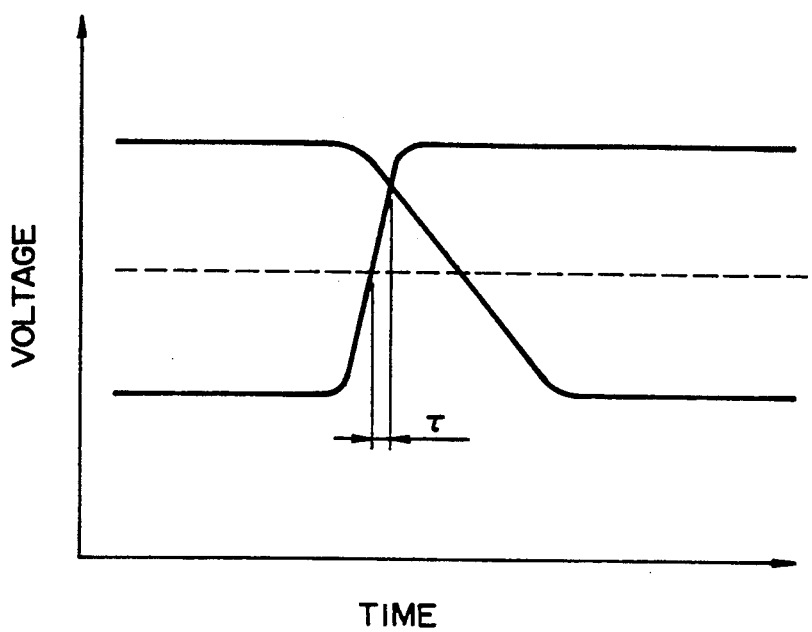
FIGS. 7A and 7B are diagrams used to explain the operation of the circuit shown in FIG. 6.
Figure 7B:
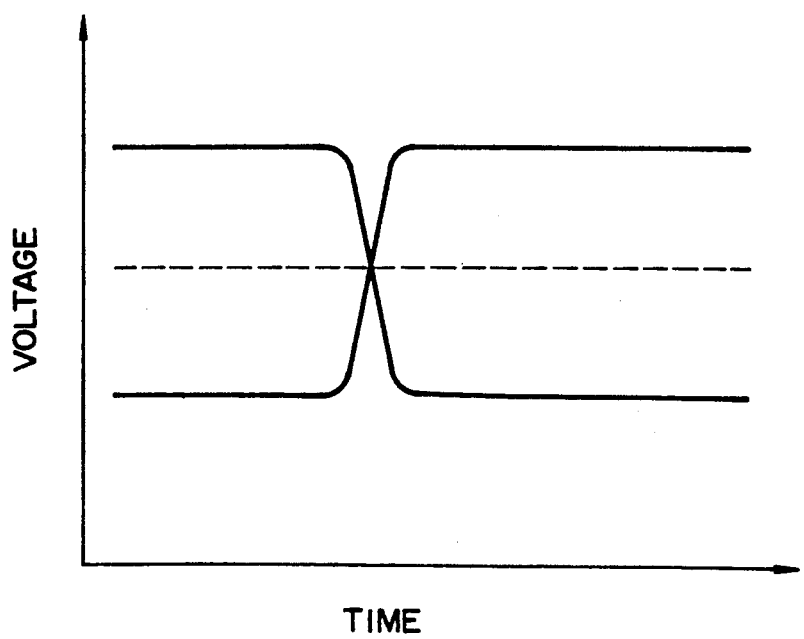

FIG. 7B shows the signal waveform observed at the receiving end of the inventive driving gate of the signal transmission scheme shown in FIG. 2B with the application of the push-pull circuit shown in FIG. 6. FIG. 7A shows, for comparison, the signal waveform of the case of using an ECL circuit. Generally, an ECL circuit has a longer signal fall time relative to the rise time, and therefore when its complementary outputs are used for differential signals, the signals have their cross point shifted upward, instead of having a 50% level of both signals. Consequently, the cross point has a delay time of $\tau$ with respect to the 50% point of the rising signal. In contrast, the push-pull circuit shown in FIG. 6 provides substantially the same switching time for the rising and falling signals, preventing the emergence of the delay time $\tau$ shown in FIG. 7A, whereby the signal propagation time can be reduced.

An examination revealed that the use of the push-pull ECL circuit shown in FIG. 6 in place of the sending end ECL circuit 6 shown in FIG. 1 accomplished the reduction of signal propagation delay time by 60 to 100 ps for a line length of 15 mm or by 200 to 250 ps for a line length of 30 mm as compared with the case of using the ECL circuit 6.

FIG. 8 is a schematic diagram showing the principal portion of the circuit arrangement based on a third embodiment of this invention. This embodiment consists in a replacement of the receiving end ECL circuit 7 shown in FIG. 1 with a high-gain amplifying circuit formed of a voltage amplifying circuit connected in series between the differential amplifier and emitter-follower. Only the high-gain amplifying circuit section is shown in FIG. 8, and the operation of this is described below.

The high-gain amplifying circuit comprises a transistor $Q_3$ which performs the voltage amplification for the output of the correct switching circuit made up of the transistors $Q_1$ and $Q_2$ and resistors $R_1$ and $R_2$, and a transistor $Q_4$ in emitter-follower configuration which performs the current amplification for the output of $Q_3$. The circuit has a higher gain of about 25 as compared with 4 to 5 of the usual ECL circuit.

By connecting the high-gain amplifying circuit at the receiving end of the line pair, the propagation delay time indicated by the point of a gain of receiving end circuit of about 25 on the scale (c) of FIG. 3A is accomplished, and it becomes possible to accomplish the transmission speed nearly equal to the propagation delay time $\sqrt{\epsilon\mu}$ for the four samples of lines shown in FIG. 3A.

The foregoing three embodiments are the cases of using the ECL circuit (FIG. 1), the push-pull ECL circuit (FIG. 6), and the high-gain amplifying circuit (FIG. 8) for logic gates which perform signal transmission among circuit elements in an integrated circuit device. These gate circuits do not have to be used separately, but they may be used preferably in arbitrary combinations in integrated circuit devices depending on each required operating speed and signal amplitude.

Figure 9:
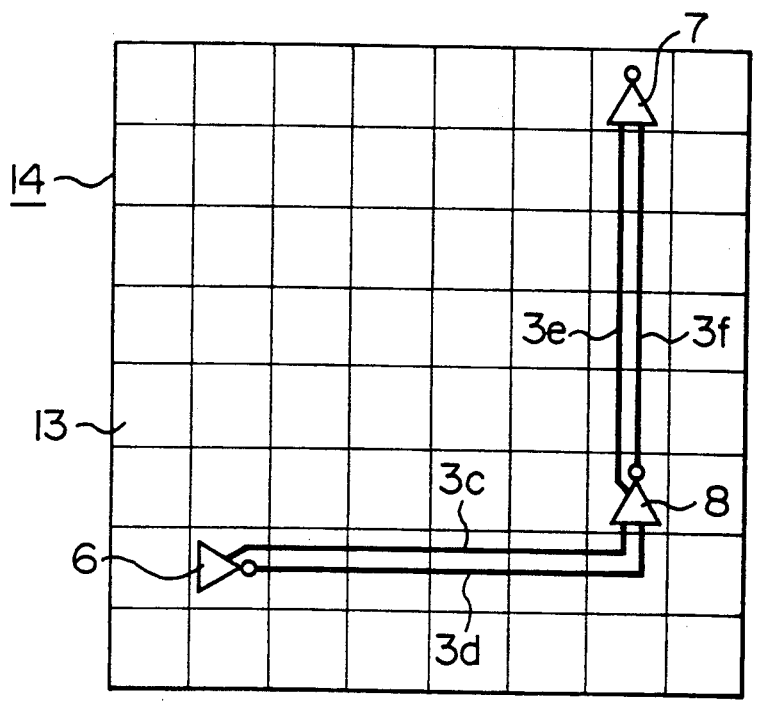
FIG. 9 is a plan view showing in brief a semiconductor integrated circuit device having an intermediate amplifier based on an embodiment of this invention.

FIG. 9 is a plan view of the integrated circuit device based on a fourth embodiment of this invention. In contrast to the arrangement of FIG. 1 in which the signal is transmitted on the line pair $3a$ and $3b$ with a line length l based on the differential transmission circuit scheme with the provision of a propagation delay time control resistor, the arrangement of FIG. 9 has the line pair bisected into line pair $3c$ and $3d$ and line pair $3e$ and $3f$ each having a length of l/2, with an intermediate amplifier 8 being placed between the pairs. This intermediate amplifier 8 may be formed in the substrate in the process of formation of the sending end and receiving end ECL circuits 6 and 7.

Figure 10:
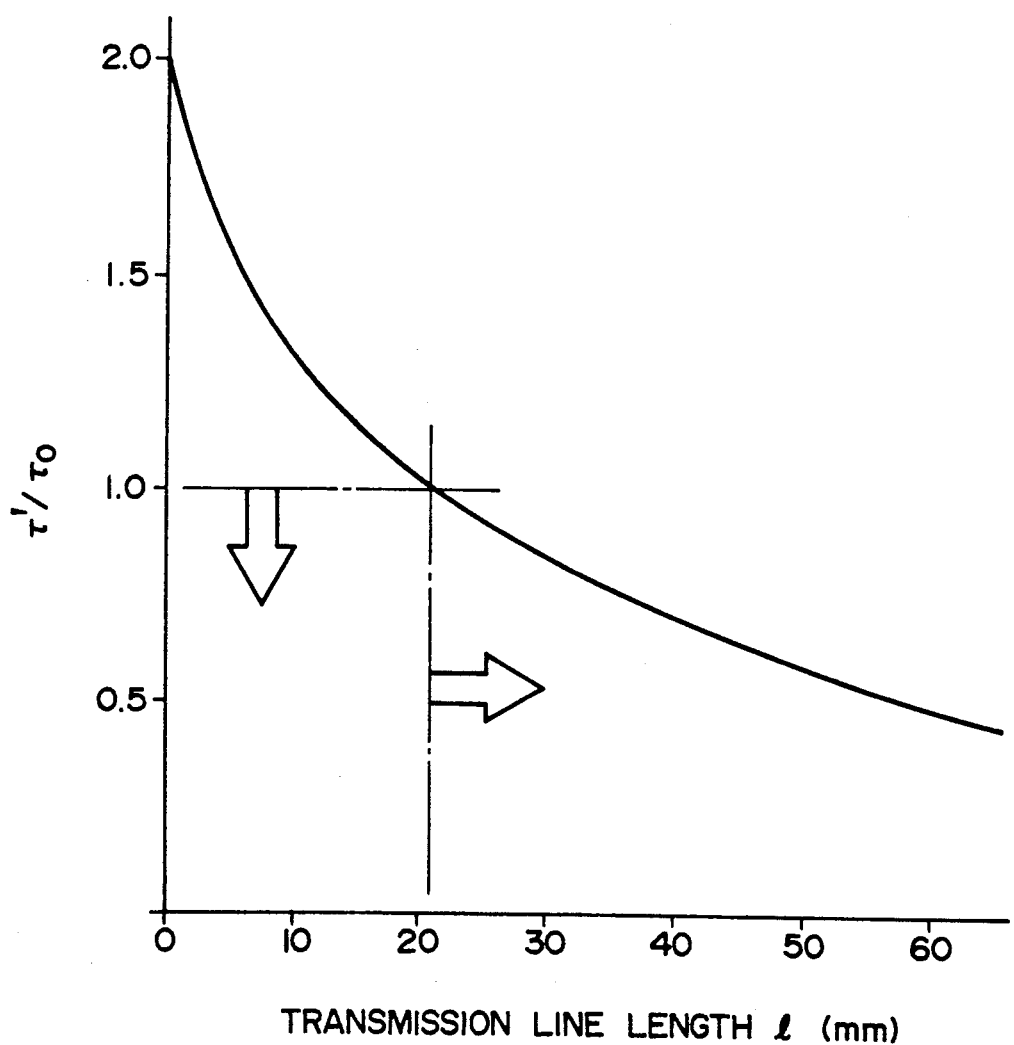
FIG. 10 is a diagram showing effectiveness of an intermediate amplifier shown in FIG. 9.

The following describes the reduction of propagation time accomplished through the division of the line pair into segments and the provision of buffer circuits between contiguous segments. FIG. 10 is a graphical representation showing the ratio $\tau'/\tau_0$ of the propagation delay time $\tau'$ with the provision of an intermediate amplifier between bisected line pairs to the propagation delay time $\tau_0$ without line division plotted on the ordinate against the line length l on the abscissa. The propagation delay time includes delay times created in the sending end logic gate and intermediate amplifier, in addition to the delay time of line pair. Since the delay time of the line pair is proportional to the line length to the power of 1 to 2, as has been explained in connection with FIGS. 3A and 3B, the sum of the delay times of two line pair segments is shorter than that without division. However, because of the presence of delay in the intermediate amplifier, the reduction of delay time of line pair must overwhelm the increased delay time due to the intermediate amplifier in order to attain the shorter overall delay time through the provision of the intermediate amplifier. The minimum value of the line length which meets this condition, i.e., the line length providing a value of 1.0 or less on the ordinate in FIG. 10, is 20 mm. Namely, the graph of FIG. 10 reveals that it is advantageous for a line pair longer than 20 mm to be bisected and driven through a buffer circuit (an intermediate amplifier) from the viewpoint of reduced propagation delay time. In this embodiment, the intermediate buffer 8, sending end ECL circuit 6 and receiving end ECL circuit 7 are all ECL circuits of the same design.

Figure 11:
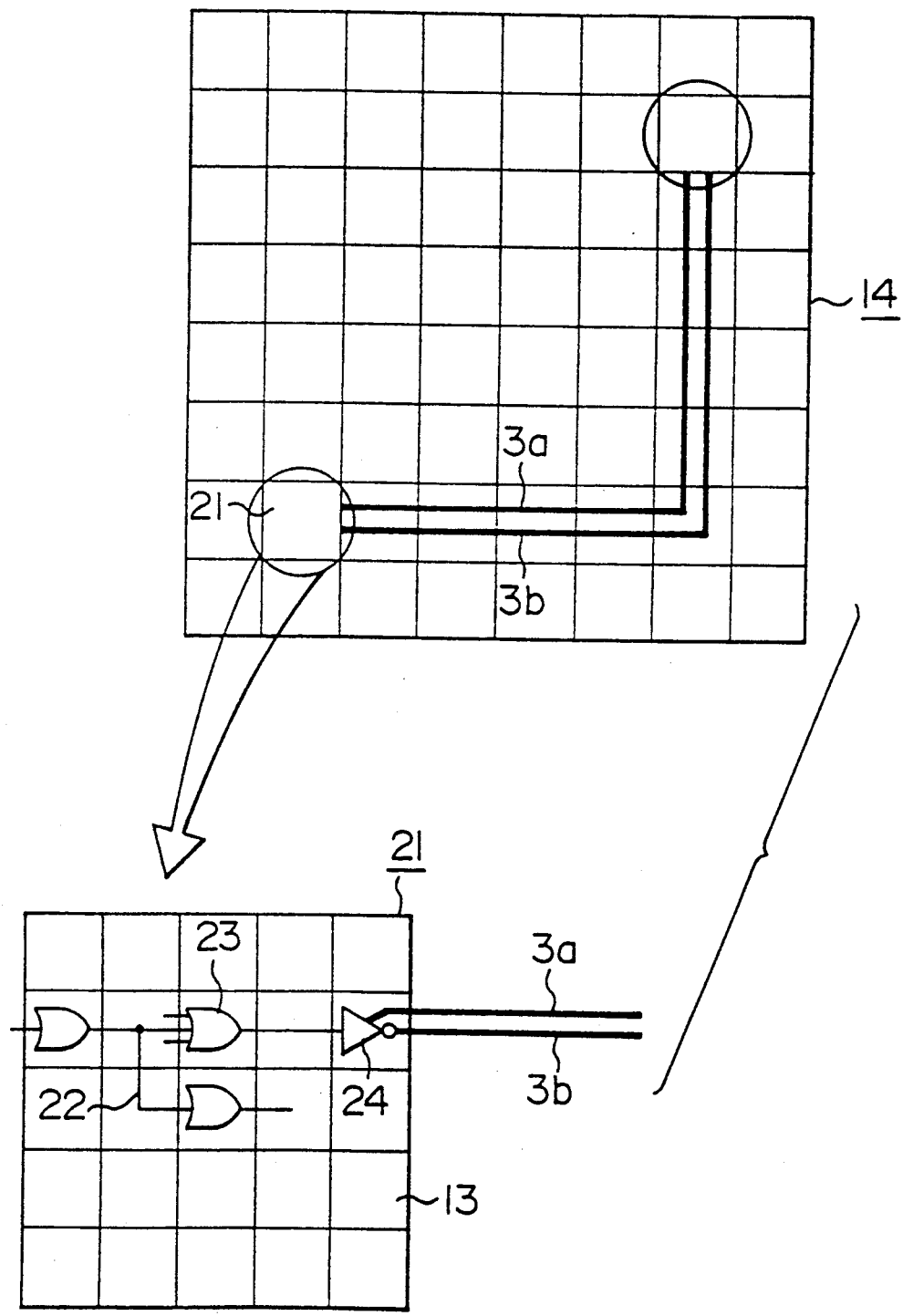
FIG. 11 is a plan view showing in brief a semiconductor integrated circuit device including a plurality of circuit blocks based on an embodiment of this invention.

FIG. 11 is a plan view of the integrated circuit device based on a fifth embodiment of this invention. In this embodiment, an integrated circuit device 14 is made up of rectangular circuit blocks 21, and each circuit block 21 is made up of circuit cells 13. Each circuit cell 13 includes a logic gate 23.

In this embodiment, signals are transmitted among logic gates within a circuit block 21 based on the near end termination shown in FIG. 2A, while signals are transmitted among circuit blocks 21 based on the line pair differential transmission scheme of the embodiments shown in FIGS. 1, 6, 8 and 2B. Namely, inside a circuit block 21, where the line length is short and thus the delay time of the line is short, the near end termination scheme shown in FIG. 2A is used, and for longer signal transmission paths between circuit blocks, the high-speed line pair differential transmission scheme shown in FIG. 2B is used.

The near end termination scheme may be used also for the connection between adjacent circuit blocks where the line length is short. As a key of choosing the signal transmission scheme depending on the line length, the near end termination scheme of FIG. 2A is used for lines shorter than the total length of two sides of the circuit block 21, and the line pair differential transmission scheme of FIG. 2B is used for longer lines.

Figure 12A:
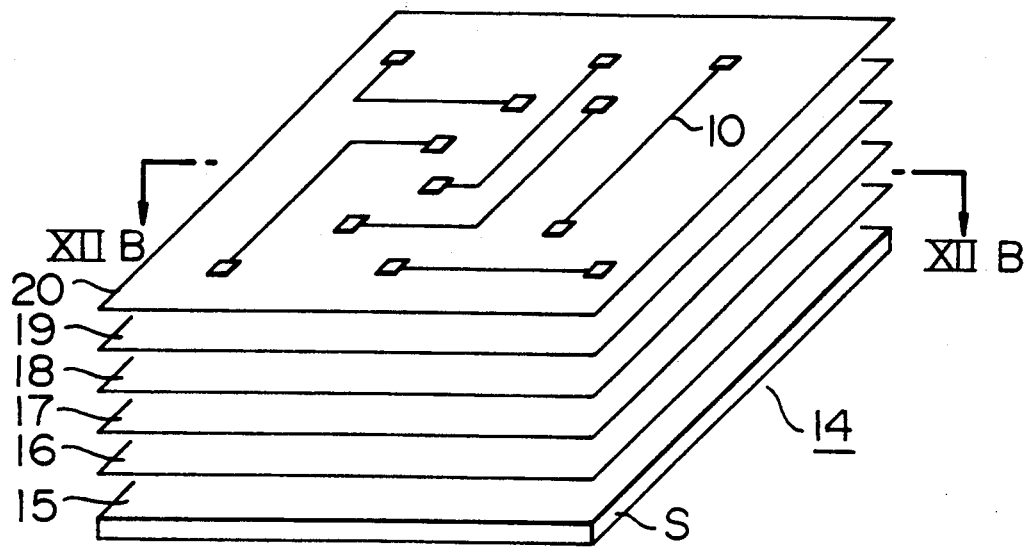
FIGS. 12A and 12B are diagrams showing in brief a semiconductor integrated circuit device having multiple laminated electrical connection layers based on another embodiment of this invention.
Figure 12B:
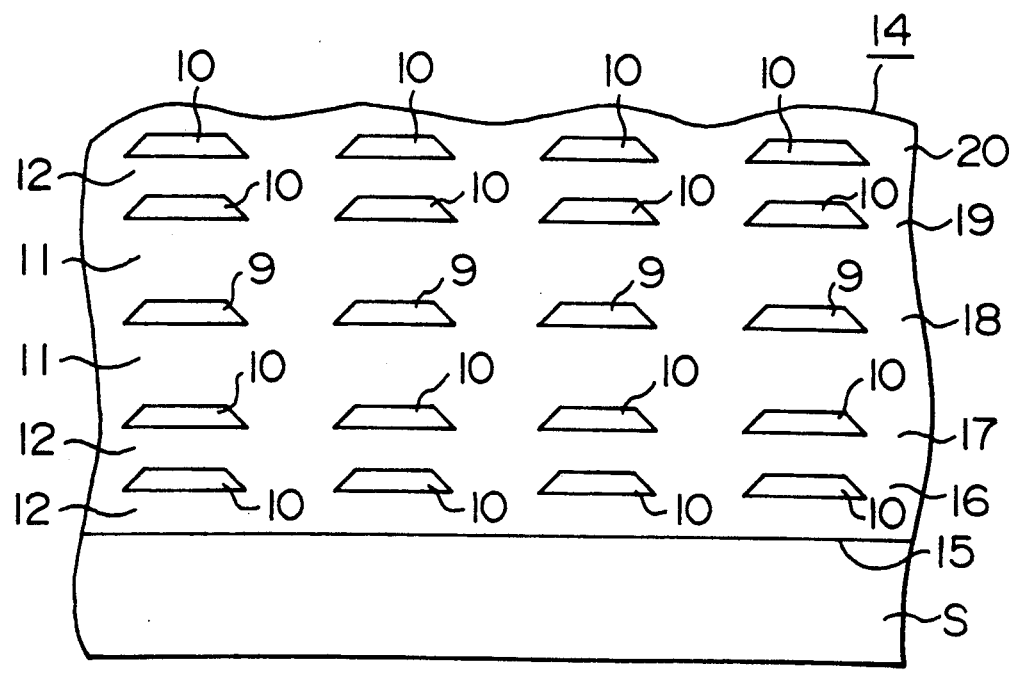

FIGS. 12A and 12B are cross-sectional diagrams of the integrated circuit structure based on a sixth embodiment of this invention. The figures show the multi-layer electrical connection structure formed over and insulated from a semiconductor substrate S within an integrated circuit chip 14. Signal lines 9 for transmitting relatively high-speed signals and signal lines 10 for transmitting relatively low-speed signals are made of aluminum, for example, and are insulated from one another by inter-layer insulation films 11 and 12 made of $SiO_2$, for example.

In this embodiment, with the intention of high-speed signal transmission line system as the whole, the distance between the high-speed signal lines 9 and low-speed signal lines 10, i.e., the thickness of the insulation film 11 for high-speed signal line, is made greater than the distance between low-speed signal lines, i.e., the thickness of the insulation film 12 for low-speed signal line, thereby to increase the characteristic impedance of the high-speed signal lines 9.

Figure 13:
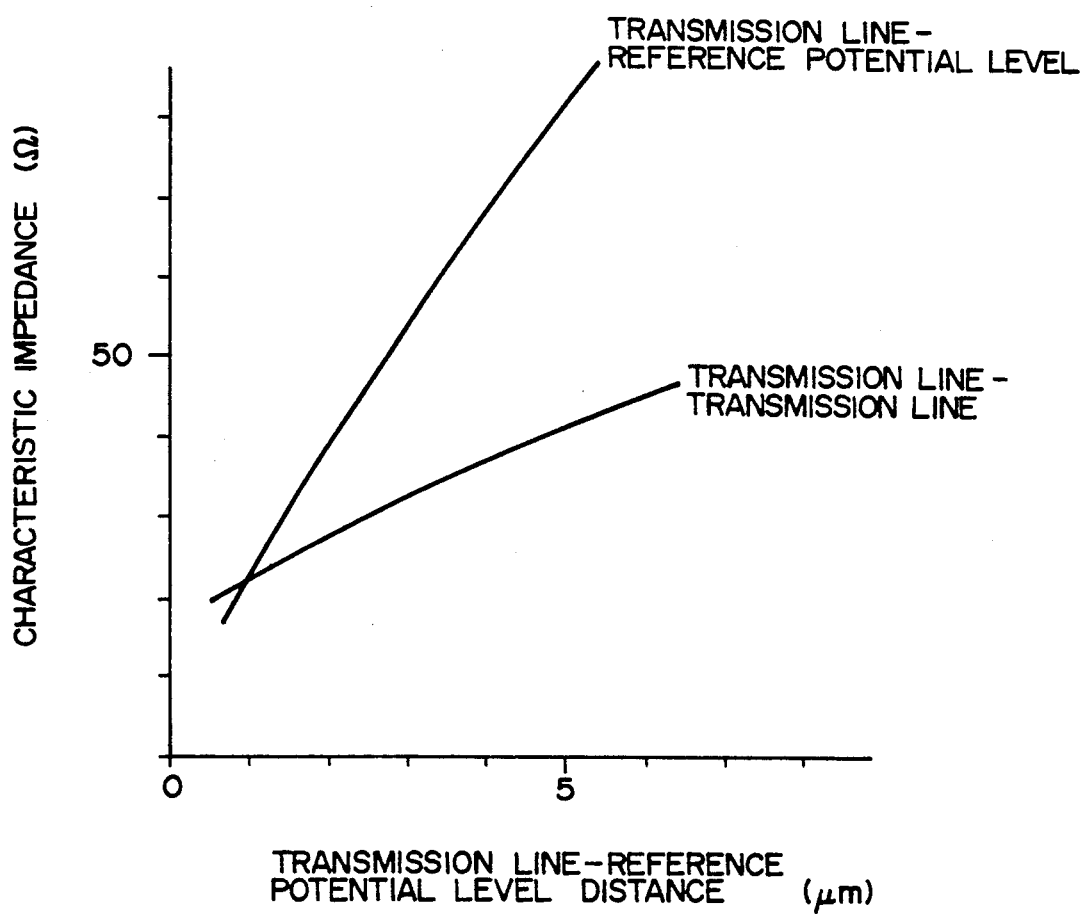
FIG. 13 is a diagram showing the relation between the characteristic impedance and the line-to-ground distance.

An increased distance between the line and ground (reference voltage level) is effective to have a higher characteristic impedance. FIG. 13 is a graphical representation showing the characteristic impedance vs. line-to-ground distance relation for line pair having a line width of 3 $\mu$m, line thickness of 1 $\mu$m, and line spacing of 2 $\mu$m. The graph reveals that at least for the range of line-to-ground distance between 1 to 5 $\mu$m, the characteristic impedance increases substantially in proportion to the distance. For the same line length and same resistance $R_T$, a shorter propagation delay time is achieved by a higher characteristic impedance Zoc as shown in FIG. 3A.

In this embodiment, both signal lines 9 and 10 have the same cross-section of 3 $\mu$m in width and 1 $\mu$m in thickness. The distance of parallel-running lines is 2 $\mu$m, the thickness of insulation layer between low-speed signal lines 10 is 1.5 $\mu$m, and the thickness of insulation layer between high and low-speed signal lines 9 and 10 is 4 $\mu$m.

By application of the high-speed signal liens 9 shown in FIG. 12A and 12B to the inter-block line pair 3a and 3b in FIG. 11, and the low-speed signal lines 10 to the intra-block line pair 22, the delay time on the line pair 3a and 3b which connect blocks 21 can further be reduced for the enhancement of performance of the integrated circuit device.

Figure 14A:
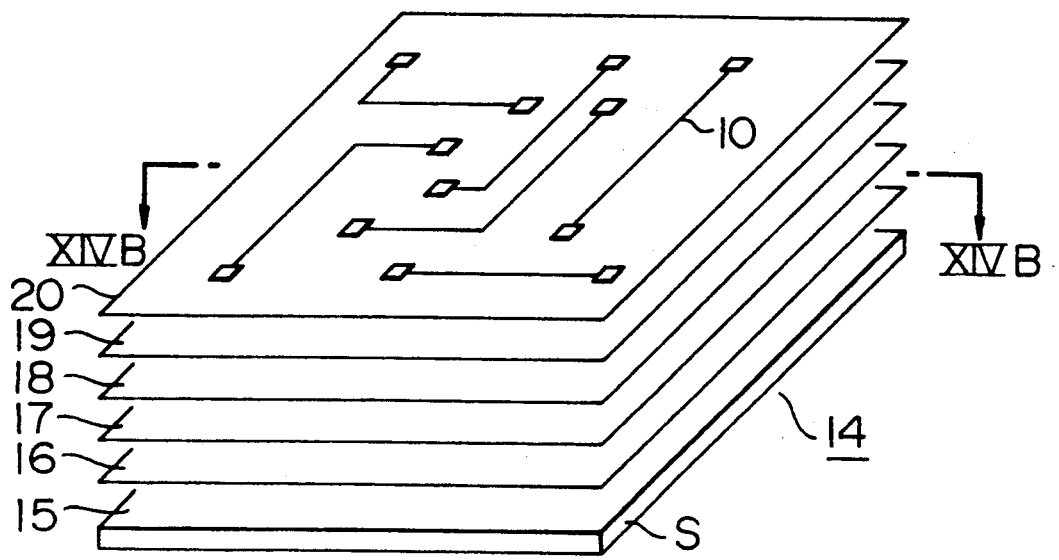
FIGS. 14A and 14B are brief diagrams of the semiconductor integrated circuit device having multiple laminated electrical connection layers based on another embodiment of this invention.
Figure 14B:
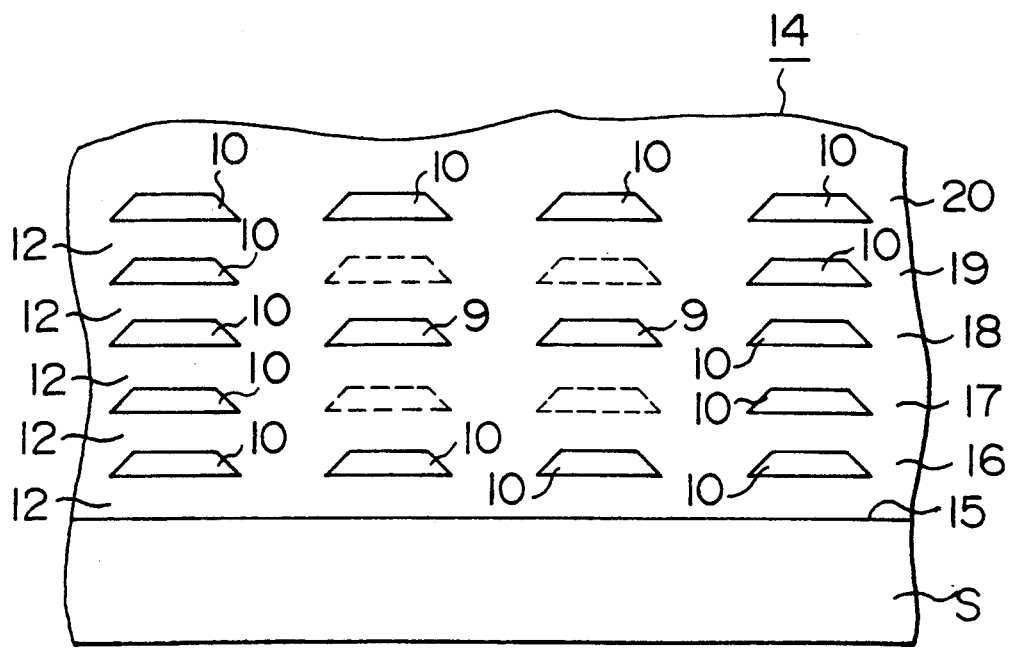

The same effectiveness of the lines structure shown in FIGS. 12A and 12B can also be achieved by providing the thickness of the insulation layers 12 invariably for all conductor layers 16–20, and by disallowing the passage of other lines above and below a signal line on which a high-speed signal is transmitted, as shown in FIG. 14A and 14B. In the figures, all insulation layers 12 have the same thickness, and lines are absent on layers (indicated by dashed line) above and below high-speed signal lines 9. This layout of signal lines allows a high-speed signal line 9 to have thicker insulation layers above and below it relative to those for a low-speed signal line 10, enabling the speed-up of signal propagation based on the same principle as shown in FIGS. 12A and 12B. Moreover, this structure allows the intermixed layout of both high-speed and low-speed signal lines on an arbitrary conductor layer, providing the enhanced latitude of line layout design.

We claim:

1. A semiconductor integrated circuit device comprising:
    a semiconductor substrate;
    a pair of signal transmission lines formed over and insulated from said semiconductor substrate and having first and second ends;
    a first circuit formed in said semiconductor substrate and electrically connected with said first end of said pair of signal transmission lines for sending an electric signal;
    termination resistances provided in said first circuit and each of said termination resistances connected to a respective one of said pair of signal transmission lines at said first end thereof thereby effecting impedance matching with said pair of signal transmission lines to prevent signal reflection; and
    a control resistance electrically connected between said pair of transmission lines at said second end for controlling a delay time of said signal propagating over said pair of signal transmission lines between said first and second ends of said pair of signal transmission lines.

2. A semiconductor integrated circuit device according to claim 1, further comprising a second circuit formed in said semiconductor substrate and electrically connected with said second end of said pair of signal propagating thereover.

3. A semiconductor integrated circuit device according to claim 2, in which each of said first and second circuits is in an ECL circuit structure.

4. A semiconductor integrated circuit device comprising:
    a semiconductor substrate;
    a pair of signal transmission lines formed over and insulated from said semiconductor substrate and having first and second ends;
    a first circuit formed in said semiconductor substrate and electrically connected with said first end of said pair of signal transmission lines for sending an electric signal; and
    a control resistance electrically connected between said pair of transmission lines at said second end for controlling a delay time of said signal propagating over said pair of signal transmission lines between said first and second ends of said pair of signal transmission lines,
    and further comprising a termination resistance means, provided in said first circuit, and a second circuit formed in said semiconductor substrate and electrically connected with said second end of said pair of signal transmission lines for receiving an electric signal propagating thereover, in which said second circuit includes a differential amplifier circuit, a current amplifier circuit and a voltage amplifier circuit connected between said differential amplifier and current amplifier circuits.

5. A semiconductor integrated circuit device comprising:
    a semiconductor substrate;

a pair of signal transmission lines formed over and insulated from said semiconductor substrate and having first and second ends;

a first circuit formed in said semiconductor substrate and electrically connected with said first end of said pair of signal transmission lines for sending an electric signal; and a control resistance electrically connected between said pair of transmission lines at said second end for controlling a delay time of said signal propagating over said pair of signal transmission lines between said first and second ends of said pair of signal transmission lines, in which said control resistance has a resistance determined such that the ratio between the resistance of said control resistance and that of each of said signal transmission lines causes said delay time of said signal to change in proportion to n-th power of a length of said pair of transmission lines, where n is a positive number smaller than 2.

6. A semiconductor integrated circuit device according to claim 5, in which the resistance of said control resistance is substantially smaller than that of each of said signal transmission lines.

7. A semiconductor integrated circuit device according to claim 1, in which said first circuit is in a push-pull type ECL circuit structure.

8. A semiconductor integrated circuit device comprising:

a semiconductor substrate;

a plurality of electrical connection layers formed over an insulated from said semiconductor substrate, said electrical connection layers being formed one over another with an electrically insulating layer interposed between two adjacent ones of said electrical connection layers, each of said electrical connection layers having at least one pair of signal transmission lines, at least one pair of signal transmission lines among the pairs of signal transmission lines being a pair of high speed signal transmission lines for propagation of a relatively high speed signal while at least one pair of signal transmission lines among the pairs of signal transmission lines being a pair of low speed signal transmission lines for propagation of a relatively low speed signal, the thickness of each of electrically insulating layers provided on and under any one of the electrical connection layers having relatively high speed signal transmission lines being larger than that of each of electrically insulating layers provided between adjacent two electrical connection layers having low speed signal transmission lines;

first circuit means formed in said semiconductor substrate and electrically connected with a first end of one pair among the pairs of high speed signal transmission lines for sending an electric signal; and control resistance means electrically connected between said pair of high speed transmission lines at a second end for controlling a delay time of said signal propagating over said pair of high speed signal transmission lines between said first and second ends of said pair of high speed signal transmission lines.

9. An integrated circuit device chip comprising:
a semiconductor substrate;
a plurality of circuit blocks of a generally rectangular shape formed in said semiconductor substrate and having logic circuits in which electrical connection of each of said logic circuits with another within one and the same circuit block is made with a single transmission line; and an electrical connection layer formed over and insulated from said semiconductor substrate, said electrical connection layer having at least one pair of signal transmission lines having first and second ends, in which one of said circuit blocks has a first circuit electrically connected with said first end of said pair of signal transmission lines for sending an electric signal, wherein termination resistances are provided in said first circuit and each of said termination resistances connected to a respective one of said pair of signal transmission lines at said first end thereof thereby effecting impedance matching with said pair of signal transmission lines to prevent signal reflection, wherein a control resistance is electrically connected between said pair of transmission lines at said second end for controlling a delay time of said signal propagating over said pair of signal transmission lines between said first and second ends of said pair of signal transmission lines, and wherein another one of said circuit blocks has a second circuit electrically connected with said second end of said pair of signal transmission lines for receiving an electric signal propagating therethrough between said one circuit block and said another one.

10. An integrated circuit device chip according to claim 9, in which the length of said pair of signal transmission lines is larger than a sum of lengths of the adjacent two sides of said rectangular circuit block.

11. A semiconductor integrated circuit device comprising:

a semiconductor substrate;

a plurality of pairs of signal transmission lines in a series connection, each of the signal transmission pairs being formed over and insulated from said semiconductor substrate and having first and second ends;

first circuit means formed in said semiconductor substrate and electrically connected with the first end of one of said signal transmission pairs for sending an electric signal, said one signal transmission pair being most-preceding in the series connection of the signal transmission pairs;

a plurality of control resistance means electrically connected between each pair of transmission lines at the second end for controlling a delay time of said signal propagating over said pair of signal transmission lines between said first and second ends of said each pair of signal transmission lines; and a plurality of intermediate amplifying circuit means each formed in said semiconductor substrate and provided between adjacent two of said series-connected plurality of pairs of signal transmission lines.

12. A semiconductor integrated circuit device according to claim 11, in which at least one pair of said pairs of signal transmission lines has a transmission length of about 20 mm or larger.

13. A semiconductor integrated circuit device according to claim 7, in which said first circuit includes a differencital circuit, an emitter follower circuit and a capacitor coupling said differential circuit and said emitter follower circuit to comprise said push-pull type ECL circuit structure.

* * * * *